United States Patent
Park et al.

(10) Patent No.: US 9,029,836 B2
(45) Date of Patent: May 12, 2015

(54) CONTROLLED SYNTHESIS OF MONOLITHICALLY-INTEGRATED GRAPHENE STRUCTURE

(75) Inventors: Jung-Ung Park, Ulsan (KR); SungWoo Nam, Champaign, IL (US); Charles M. Lieber, Lexington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 13/817,885

(22) PCT Filed: Sep. 8, 2011

(86) PCT No.: PCT/US2011/050752
§ 371 (c)(1),
(2), (4) Date: May 8, 2013

(87) PCT Pub. No.: WO2012/033869
PCT Pub. Date: Mar. 15, 2012

(65) Prior Publication Data
US 2013/0214252 A1      Aug. 22, 2013

Related U.S. Application Data

(63) Continuation of application No. 61/380,767, filed on Sep. 8, 2010.

(51) Int. Cl.
*H01L 29/06*  (2006.01)
*H01L 31/00*  (2006.01)
(Continued)

(52) U.S. Cl.
CPC .......... *H01L 21/02527* (2013.01); *B82Y 30/00* (2013.01); *B82Y 40/00* (2013.01);
(Continued)

(58) Field of Classification Search
USPC ............ 257/24, 204, 288, E21.051, E21.403, 257/E21.632; 438/142, 197, 478; 977/734, 977/936, 938
See application file for complete search history.

(56) References Cited

U.S. PATENT DOCUMENTS

2009/0155561 A1   6/2009  Choi et al.
2009/0181502 A1   7/2009  Parikh et al.
(Continued)

FOREIGN PATENT DOCUMENTS

EP    2055673 A1    5/2009
JP    2009-091174   *  4/2009
WO    2009129194 A2  10/2009

OTHER PUBLICATIONS

PCT/US2011/050752, International Preliminary Report on Patentability, Form PCT/IB/373, Form PCT/ISA/237 Cover sheet, Box Nos. 1, V, and VII, and Separate Sheet Sheets 1-5, Mar. 2013.
(Continued)

*Primary Examiner* — Asok K Sarkar
(74) *Attorney, Agent, or Firm* — Theresa A. Lober

(57) ABSTRACT

In a method for fabricating a graphene structure, there is formed on a fabrication substrate a pattern of a plurality of distinct graphene catalyst materials. In one graphene synthesis step, different numbers of graphene layers are formed on the catalyst materials in the formed pattern. In a method for fabricating a graphene transistor, on a fabrication substrate at least one graphene catalyst material is provided at a substrate region specified for synthesizing a graphene transistor channel and at least one graphene catalyst material is provided at a substrate region specified for synthesizing a graphene transistor source, and at a substrate region specified for synthesizing a graphene transistor drain. Then in one graphene synthesis step, at least one layer of graphene is formed at the substrate region for the graphene transistor channel, and at the regions for the transistor source and drain there are formed a plurality of layers of graphene.

32 Claims, 11 Drawing Sheets

(51) Int. Cl.
  *H01L 21/02* (2006.01)
  *B82Y 30/00* (2011.01)
  *B82Y 40/00* (2011.01)
  *C01B 31/04* (2006.01)
  *H01L 23/532* (2006.01)
  *H01L 29/16* (2006.01)
  *H01L 29/66* (2006.01)
  *H01L 29/778* (2006.01)
  *H01L 29/786* (2006.01)

(52) U.S. Cl.
  CPC ..... *C01B 31/0453* (2013.01); *H01L 21/02381* (2013.01); *H01L 21/02488* (2013.01); *H01L 21/02491* (2013.01); *H01L 21/02494* (2013.01); *H01L 21/02502* (2013.01); *H01L 21/0262* (2013.01); *H01L 21/02645* (2013.01); *H01L 21/02664* (2013.01); *H01L 23/53276* (2013.01); *H01L 29/1606* (2013.01); *H01L 29/66742* (2013.01); *H01L 29/7781* (2013.01); *H01L 29/78618* (2013.01); *H01L 29/78684* (2013.01); *H01L 29/66477* (2013.01); *H01L 2924/0002* (2013.01); *Y10S 977/734* (2013.01); *Y10S 977/936* (2013.01); *Y10S 977/938* (2013.01)

(56) References Cited

U.S. PATENT DOCUMENTS

2010/0025660 A1* 2/2010 Jain et al. .......... 257/24
2011/0048625 A1* 3/2011 Caldwell et al. .......... 156/233

OTHER PUBLICATIONS

PCT/US2011/050752, International Search Report, First sheet, Second sheet pp. 1-2, patent family annex, Feb. 2012.
Nam, "Assembly and Integration of Nanowires and Graphene for Nanoelectronics and Nanobiotechnology," Ph.D. Dissertation, Harvard University, Cambridge, MA, pp. 1-158, Sep. 22, 2010.
Database WPI Week 200931, Thomson Scientific, London, GB, AN 2009-H69107 XP-002667654, pp. 1-3, Apr. 2009.
Liu et al., "Large scale pattern graphene electrode for high performance in transparent organic single crystal field-effect transistors," ACS Nano 20100727 ACS USA, vol. 4 No. 7, pp. 3927-3932, Jun. 2010.
Reina et al., "Large area, few-layer graphene films on arbitrary substrates by chemical vapor deposition," Nano Letters, ACS US, vol. 9, No. 1, pp. 30-35, Dec. 2008.

* cited by examiner

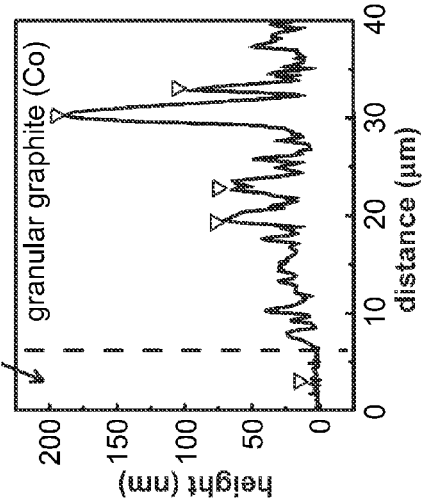
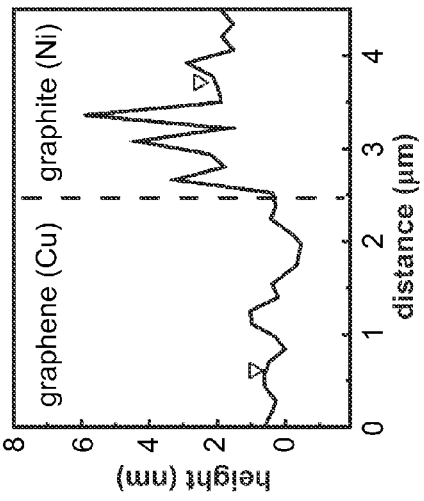
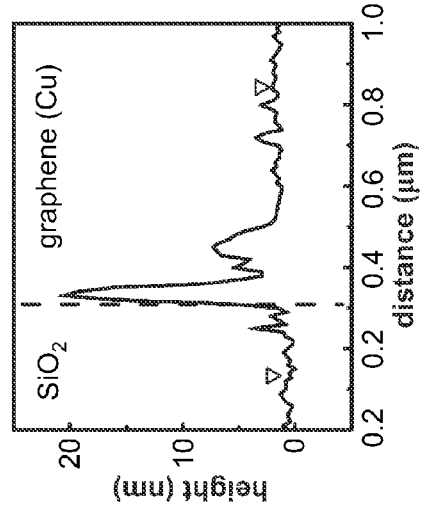
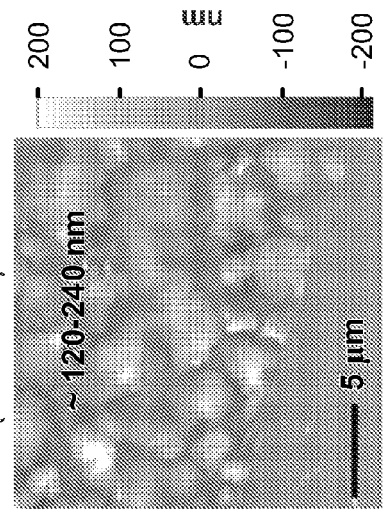
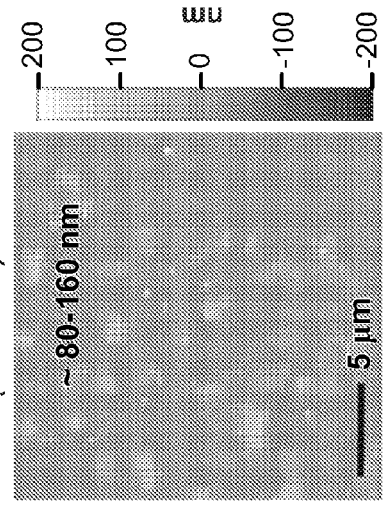
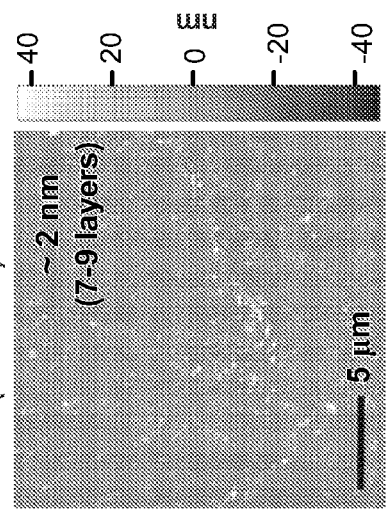

US 9,029,836 B2

CONTROLLED SYNTHESIS OF MONOLITHICALLY-INTEGRATED GRAPHENE STRUCTURE

CROSS-REFERENCE TO RELATED APPLICATIONS

This application claims the benefit of U.S. Provisional Application No. 61/380,7672, filed Sep. 8, 2010, the entirety of which is hereby incorporated by reference.

STATEMENT REGARDING FEDERALLY SPONSORED RESEARCH

This invention was made with government support under Contract USGC 15095320-HA awarded by the U.S. Central Intelligence Agency and under Contract N00244-09-1-0078-DOD35CAP awarded by U.S. Department of Defense. The Government has certain rights in the invention.

BACKGROUND

This invention relates generally to graphene, and more particularly relates to graphene synthesis.

Over the past four decades, a reduction in the size of silicon metal-oxide-semiconductor field effect transistors (MOSFETs) has been one key to the progress that has been achieved in producing advanced microfabricated, integrated electronics. But as the limit of size scaling is approached for such silicon electronics, silicon microfabrication process have become highly complicated; consequently, a demand for the simplification of fabrication processes and the use new materials, beyond silicon, has been rapidly rising for the next generation of circuits.

One proposed strategy for minimizing the intensive steps of conventional CMOS fabrication processes such as lithography, ion-implantation, annealing, deposition, and etching, is the co-synthesis of all elements in an integrated circuit. A conceptually similar approach, albeit employing chemical synthesis of individual device elements, rather than entire integrated structures, was initiated in the research field of one-dimensional (1D) nanowire/nanotubes. However, the nature of 1D materials requires assembly and additional integration steps, such as metallization, to yield integrated electronics.

Of the potential new materials to be considered for next generation circuitry, graphene is for many applications the most promising. Graphene is a single two-dimensional atomic layer of $sp^2$-bonded carbon atoms. The vertical stacking of multiple layers of monolayer graphene constitutes graphite. Graphene has attracted the attention of the materials and electronic device communities as one of the best candidate materials for post-silicon microfabrication as a result of high carrier mobility. In addition, graphene is characterized by superb electric and mechanical properties, thermal conductivity, and optical transparency.

These characteristics of graphene have led to the rapid development of processes for the synthesis of graphene, for example, by the reduction of graphene oxide, by epitaxial graphene growth out of SiC, and by chemical vapor deposition (CVD) synthesis using metal catalysts. In general, conventional graphene synthesis processes are optimized to enable formation of a layer of graphene that under select process conditions is uniform across a large area. But such processes do not address the specific materials requirements for fabricating a range of device components based on graphene materials, such as FETs and electrical interconnects. The full potential of graphene as a microfabrication material cannot be achieved until the requirements for microfabrication of graphene devices, such as FET devices and interconnects, are met.

SUMMARY OF THE INVENTION

In a method for fabricating a graphene structure, there is formed on a fabrication substrate a pattern of a plurality of distinct graphene catalyst materials. With this pattern in place, then in one graphene synthesis step, different numbers of graphene layers are formed on the catalyst materials in the formed pattern. With this process, then in a method for fabricating a graphene transistor, on a fabrication substrate there is provided at least one graphene catalyst material at a substrate region specified for synthesizing a graphene transistor channel; and at least one graphene catalyst material is provided at a substrate region specified for synthesizing a graphene transistor source, and at a substrate region specified for synthesizing a graphene transistor drain. Then in one graphene synthesis step, at least one layer of graphene is formed at the substrate region for the graphene transistor channel, and at the regions for the transistor source and drain there are formed a plurality of layers of graphene.

Based on these processes, there is enabled a graphene circuit that includes a graphene transistor channel disposed on a substrate and including at least one layer of graphene, and a transistor source and a transistor drain, each of which is connected to the transistor channel and disposed on the substrate, and each including a plurality of layers of graphene. Electrical interconnections to the transistor source and drain are provided on the substrate, each interconnection including a plurality of layers of graphene.

This graphene circuit configuration and the processes for producing the circuit offer significant advantages over conventional CMOS processes with single-step formation of entire devices and circuits during one graphene synthesis step. In addition, the ability to conduct layer-by-layer assembly of synthesized monolithic graphene/graphite patterns can be exploited, e.g., to produce flexible and transparent integrated electronic devices. The one-step graphene synthesis method to produce monolithic graphene-graphite integrated circuits thereby moves microfabrication technology to an enabled graphene-based electronics paradigm.

BRIEF DESCRIPTION OF THE DRAWINGS

FIGS. 5A-5C are plots of the height of synthesized graphene and graphite regions as measured by AFM scans along a distance across the synthesized graphene and graphite regions;

FIGS. 7A-7C are AFM images of graphene and graphite regions synthesized from a 10 nm-thick Co catalyst, a 60 nm-thick Co catalyst, and a 120 nm-thick Co catalyst, respectively;

DETAILED DESCRIPTION

To enable the microfabrication of microelectronic devices, interconnects, and circuits that include elements formed of structures including monolayer graphene, few layer graphene, and graphite layers, there are provided processes in which localized graphene areas are synthesized with differing numbers of graphene layers, by which the electrical properties of the areas can be individually and distinctly controlled. This graphene synthesis is one-step in nature, in that the areas of differing numbers of graphene layers are synthesized simultaneously. The synthesis processes provide graphene regions that exhibit predictable electrical properties and that can be formed in complex geometries of graphene and graphite that are in mechanical and electrical contact. As a result, there is enabled the ability to form complex graphene microelectronic devices and other structures that are monolithically integrated into circuits, device arrays, and electromechanical systems.

Figure 1:
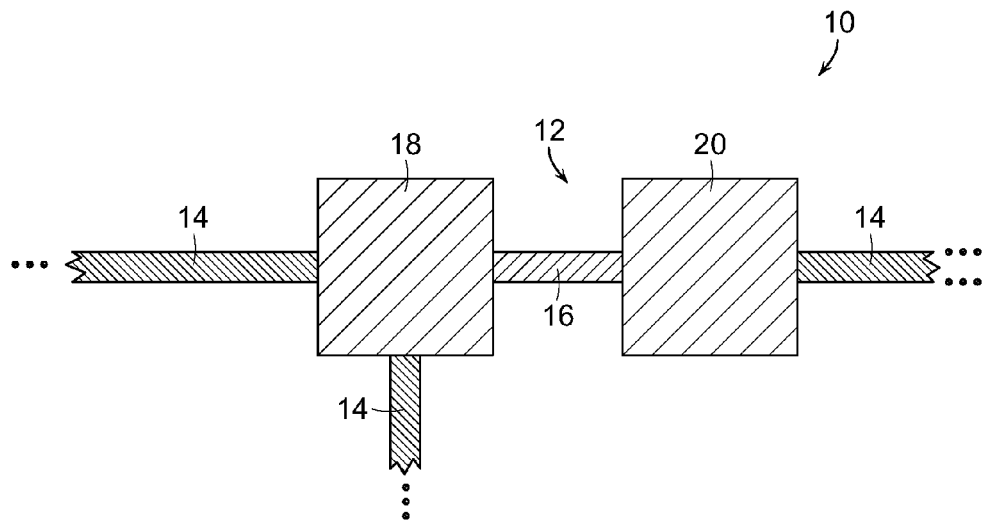
FIG. 1 is a schematic plan view of an example graphene-based FET device.

FIG. 1 is a schematic plan view of a portion of an example of such a graphene circuit 10 that includes a monolithically-integrated graphene device 12 with graphene interconnects 14. The graphene circuit 10 includes a graphene field effect transistor (FET) 12 having a channel region 16 that is at least one layer of graphene, i.e., monolayer or few-layer graphene (FLG). Source and drain regions 18, 20 are electrically connected to the channel region and provided as monolayer graphene, few-layer graphene, or graphite, and preferably are a plurality of graphene layers. For the purposes of description herein, few-layer graphene is defined as 2-3 layers of graphene, and graphite is defined as greater than about 800 graphene layers. Thus, all electrically conducting components of the FET, including source, drain, and channel, and all interconnects, are formed of monolayer graphene or some plurality of number of layers of graphene, and as explained in detail below, can be synthesized altogether during a single graphene synthesis step.

Electrical interconnection lines 14 from the FET are provided for electrical connection between the FET and other microelectronic devices such as devices, sensors, and circuits that can similarly be formed of monolayer graphene or a plurality of graphene layers, or graphite, and monolithically integrated with the circuit. Multiple graphene devices, such as the graphene FET 12 of FIG. 1, can be monolithically integrated, e.g., as an array of devices, and interconnected with monolayer graphene, a plurality of graphene layers, e.g., few-layer graphene (FLG), and/or graphite, to additional graphene or non-graphene devices and structures. Transistors, sensors, input/output connections, and other desired devices and electrical components of graphene, can be monolithically integrated. All components can be formed in a single synthesis step, in contrast to the multiple processing steps required in conventional complementary metal-oxide-semiconductor (CMOS) microfabrication processing to form field-effect transistors and interconnects.

As described in detail below, the synthesized graphene devices and circuits can be transferred onto both rigid and flexible, non-rigid operational substrates, including semi-transparent or transparent plastic films, enabling a wide range of applications. For example, there can be produced flexible semitransparent graphene FET arrays by layer-by-layer assembly of the synthesized graphene device layers for 3-D integration of structures.

In one example graphene synthesis process provided herewith, a single-step graphene synthesis is carried out employing a plurality of distinct synthesis catalysts. The graphene synthesis process can be conducted as any suitable process, such as a chemical vapor deposition (CVD) process, an ion implantation process, or other selected graphene synthesis process. The graphene synthesis is not restricted to a particular synthesis process and can be conducted employing, e.g., methane or other suitable carbonaceous gases, selected implantation species such as carbon, or other synthesis materials.

To synthesize localized and adjacent graphene areas with differing numbers of graphene layers, there can be exploited the differences in carbon solubility between various catalyst metals that are employed, for example, in a chemical vapor deposition (CVD) synthesis of graphene layers. In the CVD synthesis of graphene, carbon provided from methane gas or other carbonaceous gas dissolves in a metal catalyst, such as Ni or Co, and then monolayer graphene, graphene multilayers, or graphites form by segregation and precipitation of the dissolved carbon on the metal surface. For example, Cu, which has negligible carbon solubility of less than about 0.0001 at. % at 1000° C., compared to Ni or Co catalyst metals, can be employed as a catalyst metal on which a single layer of graphene can be synthesized by carbon adsorption on the surface of a Cu region. The higher the carbon solubility of a graphene catalyst, the greater the number of graphene layers that are formed by a graphene synthesis process in which graphene precipitates on the catalyst surface.

Figure 2:
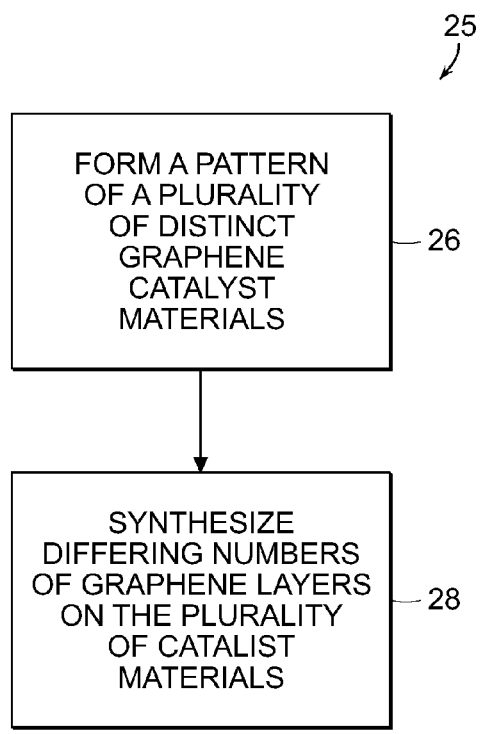
FIG. 2 is a flow chart of example process steps for synthesizing devices and circuits of graphene and graphite in a single synthesis step.

Thus, in an example CVD graphene synthesis process, the number of the grown graphene layers, n, at a selected site is controlled by selection of the catalyst material that is provided at that substrate site, given the carbon solubility differences in the various candidate catalyst metals. As illustrated in the flow chart of the graphene synthesis process 25 in FIG. 2, by forming 26 a pattern of a plurality of distinct, i.e., heterogeneous, graphene catalyst structures, e.g., an arrangement of differing metals, then there can be synthesized 28 monolithically-integrated graphene structures with locally different thicknesses, or numbers of layers, n, with each different catalyst metal producing a corresponding different number of graphene layers in one single graphene synthesis step such as a CVD step. With this process, the planar geometry of each graphene region to be synthesized can therefore be defined by lithographically patterning the arrangement of heterogeneous metal catalysts, with catalyst regions adjacent to and in contact with each other as-desired for enabling synthesis of graphene/graphite layers that are in electrical contact.

No particular catalyst pattern is required. For applications in which different graphene device regions are to be synthesized so that the regions are in electrical contact with each other, it is preferred that those graphene catalyst regions overlap each other, are touching, or are at least adjacent to each other. But there can be provided a plurality of catalyst patterns each with adjacent, overlapping or touching regions and with separate, non-adjacent regions, as prescribed for synthesizing a selected graphene device or circuit.

The graphene synthesis catalyst regions can be formed of any number of selected catalyst materials, including, e.g., Fe, Ge, Al, Cu, Ni, Pd, Pt, Au, Co, or other suitable catalyst material. Alloys of metals in any suitable combination can also be employed. Further, the metals can be employed in combination as sandwiched layers of catalyst materials, and can be employed in any layered combination.

For a selected set of graphene synthesis materials, there is provided at each region of synthesis a corresponding catalyst material that will produce a selected number of graphene layers for that region. Given an example graphene CVD synthesis process to be carried out at 1000° C., it is found that the example catalyst materials given just above can be distinctly characterized by the degree solubility of carbon into the materials at that temperature. A first group, including Cu, Pt, Ge, and Au, is characterized by very low carbon solubility, less than about 0.1 atomic %. A second group, including Ni, Co, and Pd, is characterized by a medium degree of carbon solubility, of at least about a few atomic % and less than about 10 atomic %. A third group, including Fe and Al, is characterized by relatively high carbon solubility, of tens of atomic %.

With this characterization, the first group of materials, Cu, Pt, Ge, and Au, are suitable catalyst materials for synthesizing regions of monolayer graphene and a small number of a plurality of graphene layers, e.g., few-layer graphene. The second group of materials, Ni, Co, and Pd, are suitable materials for synthesizing regions of a plurality of graphene layers, e.g., multilayer-graphene and graphite. The third group of materials, Fe and Al, are suitable for synthesizing thick graphite. Based on this characterization, an arrangement of these catalyst materials can be selected and patterned to produce with one graphene CVD synthesis step a corresponding pattern of differing numbers of graphene layers.

It is further recognized that the thickness of the catalyst materials impacts the number of graphene layers that are synthesized. In general, the thicker a catalyst material region, the more layers of graphene that the region synthesizes, due to an increased catalyst volume that is available for carbon dissolution within that volume. For the second and third groups of catalyst materials given just above, this consideration can be exploited to fine tune the number of graphene layers that are synthesized.

The particular graphene synthesis process and process temperature are also recognized to impact the number of graphene layers that are synthesized. For example, a process to synthesize graphene on the catalyst materials by CVD can be carried out at any suitable temperature, e.g., between about 300° C.~1100° C., employing a suitable deposition process, including plasma enhanced chemical vapor deposition (PECVD) or other deposition process. The temperature of the CVD process impacts the number of graphene layers that are synthesized on a given catalyst material. In general, a higher synthesis temperature synthesizes a larger number of graphene layers because a temperature increase correspondingly increases the solubility of carbon in a material.

With consideration of these three variables, namely, catalyst species or species combination, catalyst thickness, and graphene synthesis temperature, the precise synthesis of pre-specified numbers of graphene layers in regions configured in a selected geometric arrangement can be achieved. Any number of catalyst materials and catalyst material thicknesses can be employed in the graphene synthesis step to monolithically integrate regions of differing numbers of layers of graphene, from monolayer graphene to thick graphite. The example catalyst materials described herein are not limiting, and any suitable catalyst material can be employed.

Given a 1000° C. synthesis temperature, then with these considerations, for example, 2-3 layers of graphene can be synthesized with a Cu catalyst layer of about 700 nm in thickness under a 5 nm-thick Ni coating, which can be preferred to prohibit oxidation. Under selected conditions, monolayer graphene can also be synthesized for this catalyst. 6-8 layers of graphene can be synthesized with a Cu catalyst layer of about 700 nm in thickness with an upper 25 nm-thick Ni coating. Thick graphite, e.g., of about 850 graphene layers, can synthesized with a sandwich of a layer of Cu of about 700 nm in thickness, an upper layer of Ni of about 5 nm in thickness, and a top-most layer of Co of about 400 nm in thickness. These examples demonstrate how catalyst species and thicknesses can be selected to fine-tune the number of graphene layers to be synthesized.

Figure 3:
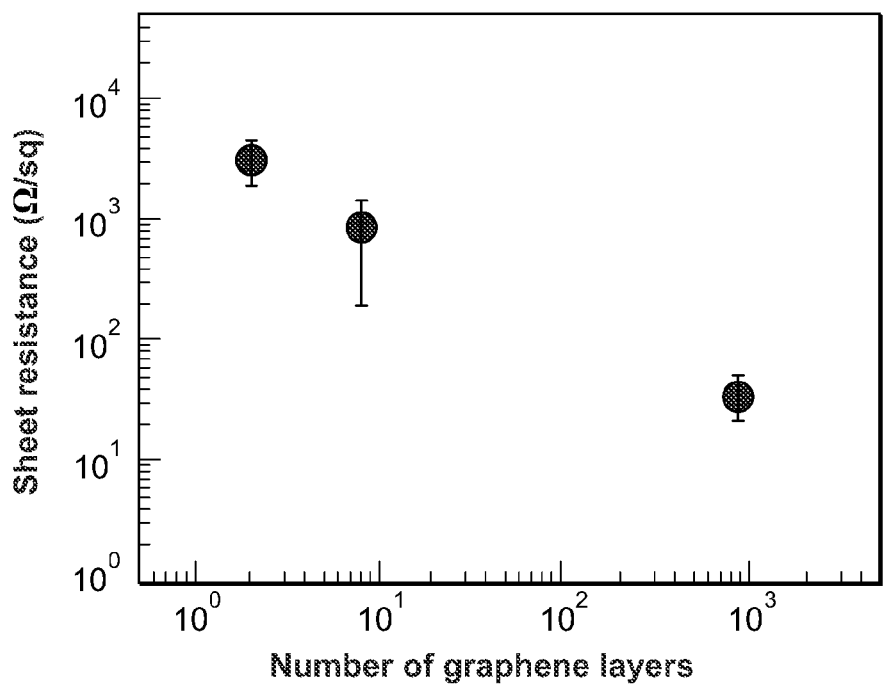
FIG. 3 is a plot of measured electrical sheet resistance as a function of synthesized number of graphene layers.

With this graphene synthesis control, there is provided the ability to modulate the electrical properties of a specific region of graphene layers by controlling the number of graphene layers that are synthesized at that region. The conductivity or sheet resistance of graphene multilayers can be controlled over more than two orders of magnitude by synthesizing graphene of differing number of layers from different metal catalysts. FIG. 3 is a plot of measured sheet resistance of graphene multilayers, as a function of number of layers, n. This data was determined based on measurement of the resistance, R, of the graphene multilayers using four-probe electrical characterization. This measured data demonstrates that the sheet resistance of graphene can be reduced by about two order of magnitudes, from $3,155\pm1,238$ $\Omega/sq$, down to $34\pm13$ $\Omega/sq$, as the number of layers, n, is increased from about 2-3 layers to about 850 layers.

The ability to achieve this range in sheet resistance is particularly advantageous for enabling all-graphene monolithic circuit and device integration. The low sheet resistance and low field-effect response that is characteristic of thick graphite can be exploited for producing graphite conductive films and electrodes. The superior transconductance that is characteristic of thin graphite and few-layer graphene can meanwhile be exploited for producing a graphene channel of a graphene FET or other device. The capability to modulate the sheet resistance and transconductance of graphene regions by controlling the number of graphene layers at each region enables the formation of monolithically integrated transistors with graphene channels and graphite electrodes as in FIG. 1.

In an example microfabrication process for producing the graphene FET of FIG. 1, a selected plurality of distinct graphene catalyst materials are patterned into prespecified catalyst regions, with each catalyst material disposed at a pattern site corresponding to an a priori specified graphene layer number, n, that is desired for that pattern site. The catalyst materials can be provided on any suitable fabrication substrate and the fabrication substrate can be employed in a final device and circuit platform, as an operational substrate, or can be used as a handle substrate only, from which the graphene structures are removed for positioning on another operational substrate.

Figure 4A:
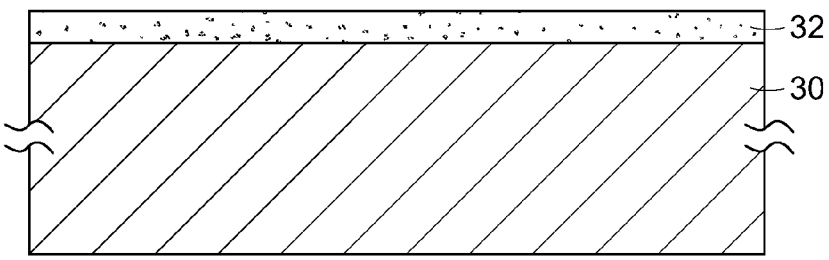
FIGS. 4A-4G are schematic cross-sectional views of a monolithically fabricated structure at stages of an example process for fabrication of graphene and graphite circuits and devices.
Figure 4B:
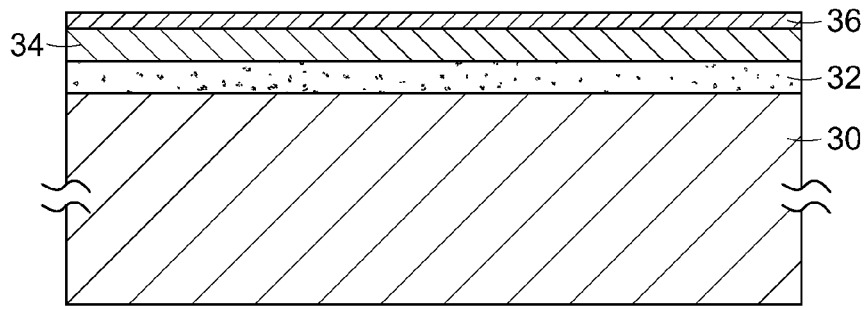
Figure 4C:
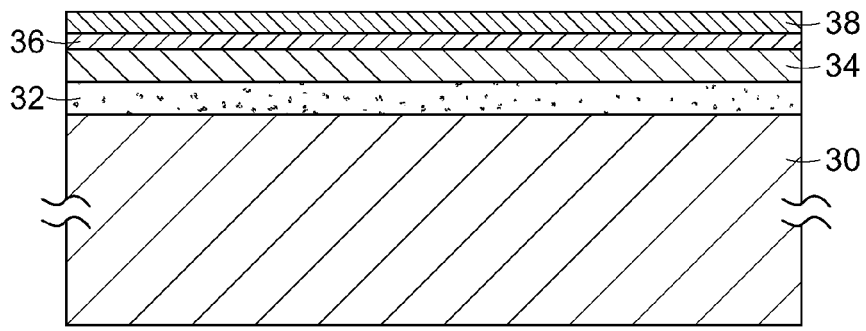

Referring to FIG. 4A, for many applications, it can be advantageous to synthesize the graphene structures on a silicon dioxide layer. In this example, there can be employed a silicon wafer 30 or other fabrication substrate on which is disposed a silicon dioxide layer 32, of, e.g., about 600 nm in thickness. Referring to FIG. 4B, in one example process, to synthesize an FET channel of at least one graphene layer, e.g., monolayer graphene or 2-3 graphene layers in thickness, a blanket layer 34 of the catalyst Cu, or other suitable material, of, e.g., about 700 nm in thickness, with an upper 5 nm-thick blanket Ni passivation layer 36, can be provided on the silicon dioxide layer 32. To form the graphite source and drain regions of a plurality of graphene layers, e.g., >800 layers, such as 850 graphene layers, a blanket layer 38 of, e.g., 400 nm-thick Co or 20 nm-thick Ni is formed over the Cu layer 34 as shown in FIG. 4C. All of the metal deposition can be conducted by, e.g., thermal or E-beam evaporation from a suitable target material.

Figure 4D:
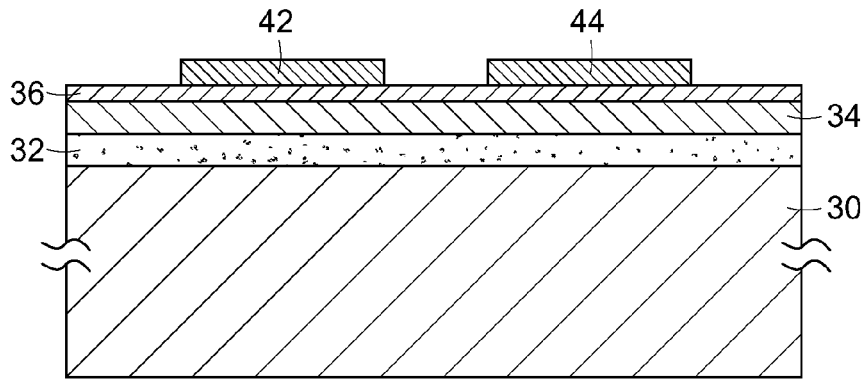

Then, as shown in FIG. 4D, the Co or Ni layer for source and drain catalysts is lithographically patterned and etched, e.g., with a lift-off process, to define the locations of source and drain graphite catalyst regions 42, 44. Additional patterning can be carried out to form, e.g., graphite interconnections or other electrical patterns as shown in FIG. 1.

With the catalyst materials patterned at selected locations on a substrate, the synthesis of monolithically integrated graphene and graphite patterns is conducted. In one example synthesis process, the catalyst-deposited substrate is loaded onto an edge of a quartz chemical vapor deposition chamber and the chamber furnace temperature ramped to a selected synthesis temperature, e.g., about 1000° C., under the flow of, e.g., $H_2$ gas at a flow rate of about 1200 sccm and Ar gas at a flow rate of about 500 sccm. When the furnace reaches the selected graphene synthesis temperature, the substrate is quickly moved to the center of the heating zone, e.g., in no more than about 20 sec, using a load-lock system, e.g., to enable rapid thermal heating of substrate. This ramping and loading process and rapid thermal heating condition is understood to be preferable for retarding lateral diffusion of the catalyst metals during the temperature ramping.

Figure 4E:
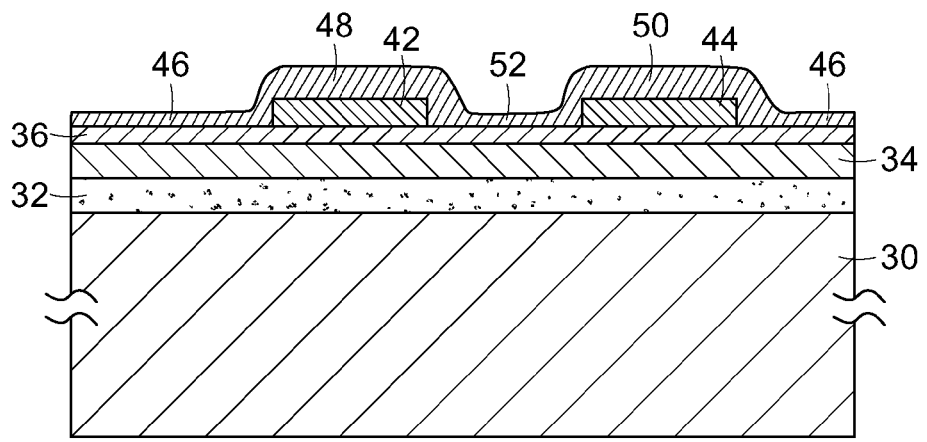

CVD synthesis of the graphene materials can then be carried out, e.g., under conditions of atmospheric pressure with a flow of, e.g., about 25 sccm of $CH_4$ and a flow of, e.g., about 1200 sccm of $H_2$, for a selected duration, e.g., 4 minutes. The chamber is then cooled to room temperature under the flow of, e.g., Ar, at a flow rate of about 1200 sccm, to complete the synthesis of graphene and graphite structures. The resulting arrangement, shown in FIG. 4E, provides a blanket 46 of 2-3 layers of graphene. Graphite source and drain regions 48, 50 of about 850 graphene layers are formed on the corresponding catalyst regions 42, 44, and the region 52 between the source and drain regions 48, 50 will be defined as the FET channel. The source and drain regions 48, 50 are connected to the graphene regions because the graphene layers grew both on the top and on the sides and edges of the source and drain catalyst regions. The channel can be gated by, e.g., the substrate, in a back-gate arrangement, can be gated in a top-gate arrangement, as will be shown below, or can be gated through exposure of the channel to an environment, as in, e.g., a sensing application, as explained in detail below.

Once graphene and graphite regions are synthesized, the graphene in the field region other than the channel region 52 can be etched away, e.g., with oxygen plasma etching such as an inductively-coupled plasma reactive ion etch (STS), or the entire structure first can be transferred to a selected operational substrate, as discussed above, and then etched. In one example of such, a suitable handle material, e.g., Poly(methyl methacrylate) (MicroChem Corp., 950 PMMA C2) is provided as a supporting layer. Such can be spun on the synthesized graphene/graphite pattern on the fabrication substrate. The catalyst metals of Cu, Ni, and Co can then be removed, e.g., by immersing the structure in a diluted etching solution of $FeCl_3:HCl:H_2O$ in a ratio of, e.g., about 1:1:20 vol. %. In such a process, the graphene/graphite structures covered with the PMMA float on the surface of the etchant as the metals are removed by the etchant.

The floating structure of handle layer and graphene/graphite structures can then be transferred from the surface of the solution for rinsing. After rinsing, the configuration can be transferred onto an operational substrate, and the PMMA or other supporting handle layer or layers can be removed with, e.g., acetone, to provide the graphene/graphite pattern on the operational substrate. An operational substrate of, e.g., silicon, having, e.g., a silicon dioxide coating, can be employed, or other suitable substrate. If the graphene configuration is to be employed in a back-gated device arrangement, then the operational substrate is preferably a good electrical conductor, e.g., as a degenerately-doped silicon wafer or other material.

Figure 4F:
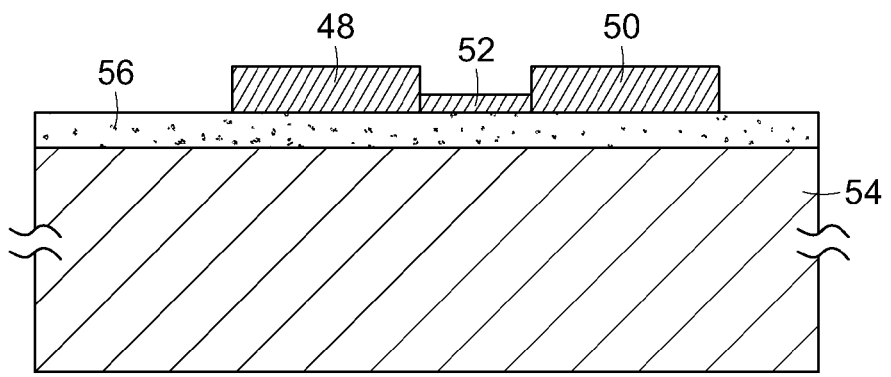

Referring to FIG. 4F, once the graphene pattern is in place on a selected operational substrate 54 that preferably includes an oxide layer 56 or other suitable layer, the field graphene can be etched away as explained above, if such has not yet been completed, to produce a channel 52 of at least one layer of graphene between the graphite source and drain regions 48, 50. While a channel of few-layer graphene is described in this example, it is to be recognized that monolayer graphene, or thin or thick graphite can also be employed as the channel where desired. With the graphene device pattern complete, graphene or metal contact pads can then be formed on the graphene devices and/or graphite interconnections and leads, in any manner required for a given application. For example, contact pads can be formed of a 3 nm-thick layer of Cr with an upper Au layer of about 60 nm in thickness, defined by lithography and lift-off processes. With this step, a graphene circuit, including at least one graphene FET, is complete.

Figure 4G:
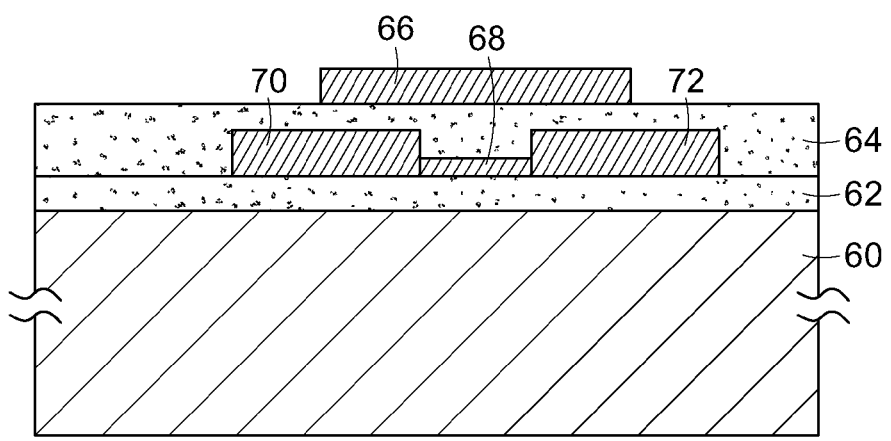

Monolithic top-gated graphene FETs can also be fabricated with the one-step graphene synthesis process. In one example of such, after graphene device synthesis, forming a structure like that shown in FIG. 4E, the graphene grown in the field region can be etched away with $O_2$ plasma, as explained above. Then, referring to FIG. 4G, the synthesized graphene/graphite patterns can be transferred onto an operational substrate 60, e.g., a flexible and transparent PEEK (polyether ether ketone) film on which an adhesion E-beam layer 62 of $SiO_2$ of, e.g., about 50 nm in thickness, is pre-deposited, or other suitable material or operational substrate, such as a silicon wafer or other microelectronic substrate. A channel dielectric layer 64 is then formed over the structure, e.g., by evaporation of a $SiO_2$ layer of, e.g., about 200 nm, on the entire area except probe-contact regions, e.g., using a PDMS shadow mask.

Then a top layer 66 of monolayer graphene or a plurality of graphene layers, e.g., about 6-8 graphene layers, that is synthesized separately on another fabrication substrate in the manner given above, e.g., with a catalyst layer of Cu of about 700 nm in thickness with an upper 25 nm-thick Ni coating, is transferred onto the dielectric layer 64 to form a top gate over the channel. Electrical connections to regions of source 70 and drain 72 can then be defined as well as the top gate geometry, by the plasma etch described above, to complete the fabrication of the top-gated graphene integrated device or devices.

These fabrication examples describe multi-layer graphene and graphite synthesis, but it is to be understood that monolayer graphene can also be synthesized in the same processes. These examples further demonstrate how graphene synthesis can be employed for producing entire circuits and devices. It is to be recognized that these fabrication processes can be employed to form any number of devices, interconnections, or arrays, and there is no limitation as to number of catalysts or their patterned arrangement.

There further is no limitation as to the device and/or circuit arrangement and operational substrate on which the graphene devices are employed. A synthesized arrangement of monolayer graphene, few-layer graphene, and graphite patterns can be applied to any selected substrate, employing the transfer process described above, or by direct synthesis on the substrate, as desired. Furthermore, device layers can be vertically synthesized by layering any number of synthesized patterns, to produce, e.g., 3-D monolithic integration of monolayer graphene, few-layer graphene, and graphite components.

One important example of such is the fabrication of flexible and semitransparent, topgate monolithic graphene transistor arrays. Flexible electronics represents an important application area that can particularly exploit the monolithic integration of graphene-graphite devices. For integrated electronics with flexible forms, the single-step graphene synthesis technique enables the production of an entire device area, including interconnect lines, in a single step, and the assembly of multiple components of FETs vertically on substrates such as flexible and/or semitransparent or transparent plastic films. In this way, monolithically integrated, flexible and semitransparent topgate FET arrays can be built, with all of the electrically conducting components composed of graphene/graphite. Such arrays can be employed for sensing applications, including biosensing, and for optical applications.

EXAMPLE I

A geometry of Cu, Ni, and Co graphene catalyst layers was formed for synthesizing differing numbers of graphene layers simultaneously. A silicon fabrication substrate having a top layer of silicon dioxide of about 250 nm in thickness was coated with a film of Cu of 700 nm in thickness having a 5 nm-thick Ni passivation layer to protect against Cu oxidation. Regions of Co of 10 nm, 60 nm, 80 nm, and 120 nm in thickness were patterned and regions of Ni of 20 nm in thickness were patterned in various shapes, all on the Cu/Ni layers. The catalyst structures were subjected to a graphene synthesis step as described above, with the temperature ramped to 1000° C. while the structure was positioned at the edge of the furnace, under the flow of $H_2$ gas at 1200 sccm and Ar gas at 500 sccm. When the furnace reached the graphene synthesis temperature, the substrate was quickly moved to the center of the heating zone. CVD synthesis of the graphene materials was then be carried out under conditions of atmospheric pressure with a flow of 25 sccm of $CH_4$ and a flow of 1200 sccm of $H_2$, for 4 minutes. The chamber was then cooled to room temperature under the flow of Ar at 1200 sccm, to complete the synthesis of graphene and graphite structures.

After the CVD synthesis step, PMMA was spun on the synthesized graphene/graphite configuration and the catalyst metals were removed by immersing the structure in a diluted etching solution of $FeCl_3$:HCl:$H_2O$ in a ratio of 1:1:20 vol. %. The handle PMMA layer with synthesized structures was then rinsed and the configuration transferred onto an operational substrate provided as a silicon wafer having a 285 nm-thick silicon dioxide top layer, and the PMMA was removed with acetone. Because of the optical reflection difference at the interface between air, graphene multilayers, and the underlying $SiO_2$ layer, different graphene thicknesses optically present differing colors, and such can be convenient for optically characterizing synthesized regions.

The local thicknesses of the synthesized graphene patterns were scanned with an atomic force microscope (AFM). FIG. 5A is a plot of height for the graphene produced over the Cu/Ni field region of the substrate—showing a difference across this graphene region of less than about 1 nm. Here 2-3 layer graphene was formed. FIG. 5B is a plot of height for graphene produced from the Ni catalyst regions, of about 2 nm in thickness and about 6-8 graphene layers. Here the graphene is about 1.5 nm thicker than the graphene that was synthesized from the background Cu. Graphite with a thickness of about 40-190 nm, of about 120-550 graphene layers, was grown from the Co catalyst region. FIG. 5C is a plot of height of this granular graphite that resulted for the Co catalyst, indicating a difference across this region of about 40-190 nm.

Figure 6:
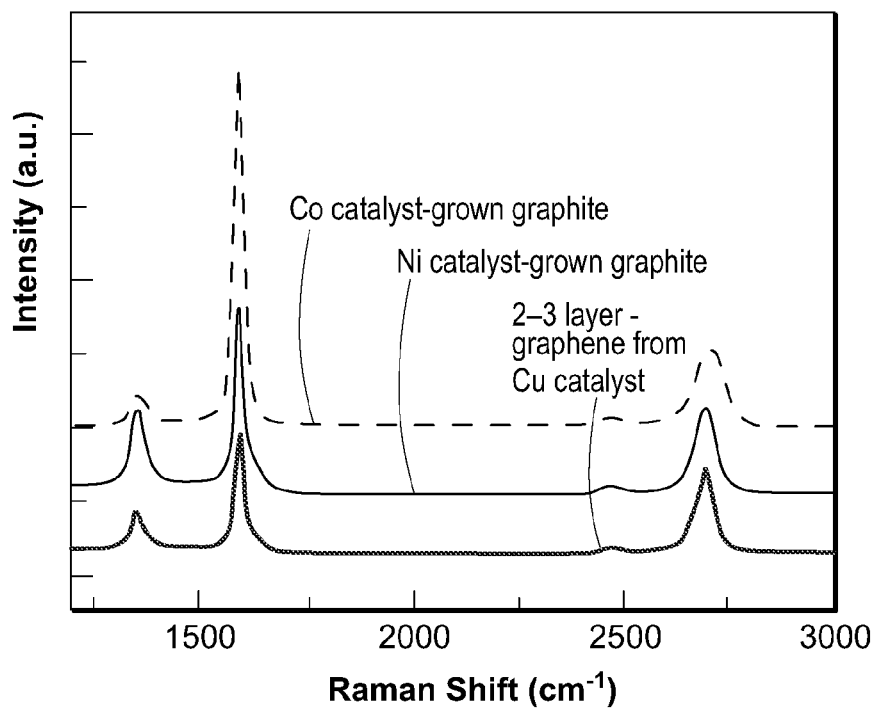
FIG. 6 is a plot of Raman spectra measured for synthesized graphene and graphite layers.

FIG. 6 is a plot of Raman spectra from the three different graphene/graphite regions whose height is mapped in FIGS. 5A-5C. The Raman spectra were recorded with a WITec CRM200 Raman system with a 532 nm laser as excitation source using a 100× objective lens having a spot size of about 1 μm. Three characteristic bands, namely, D, centered at about 1350 $cm^{-1}$; G, centered at about 1590 $cm^{-1}$; and 2D, centered at about 2680 $cm^{-1}$; of graphene/graphite were detected from all areas. The background graphene area synthesized from the blanket Cu/Ni layer showed that the G band's intensity was comparable to the 2D band's intensity, confirming that the scanned area was composed of 2-3 layer graphene. As the number of graphene layers, n, was increased further, the G band's intensity was enhanced significantly, and the 2D band became non-symmetric and dispersive, i.e., broader, with a slight blue shift, indicating a true graphite structure with interlayer binding. In addition, mapping results showed that the graphite pattern was continuous and connected to the background thin few-layer graphene area, successfully demonstrating monolithic synthesis of interconnected layers of differing thicknesses and number.

FIGS. 7A-7C are AFM images of the graphene layers and graphite produced with the Co catalyst of 10 nm, 60 nm, and 120 nm, respectively. Here it is shown that the grain sizes of the graphite increased with the thickness of the Co catalyst region, and the graphitic grains were connected together to form continuous film-like graphitic structures when the Co was thick enough (>~350 nm).

Figure 8A:
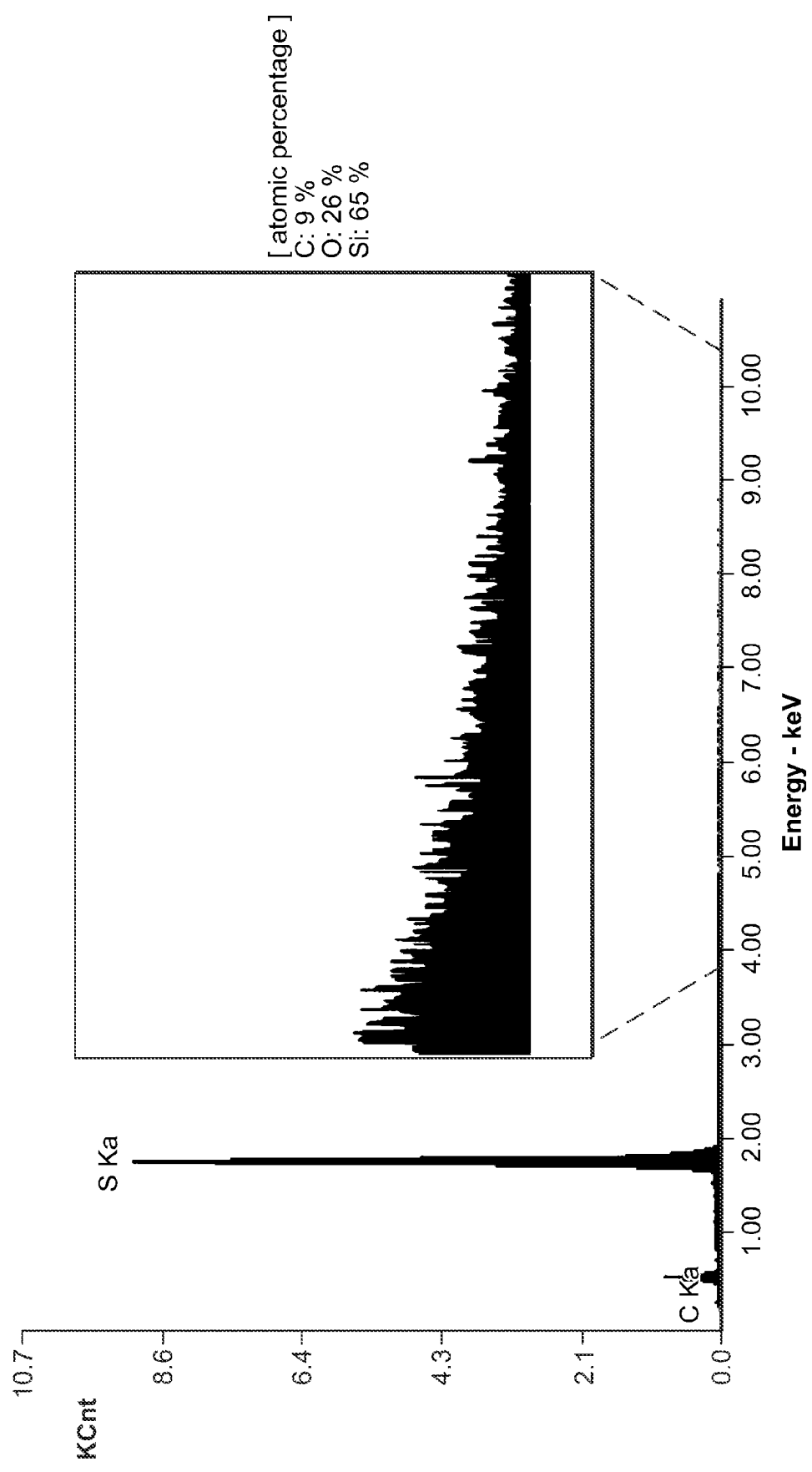
FIGS. 8A-8B are plots of EDAX and XPS analysis, respectively, of synthesized graphene/graphite structures, taken after etching away Cu, Ni, and Co catalyst metals off of the synthesized structures.
Figure 8B:
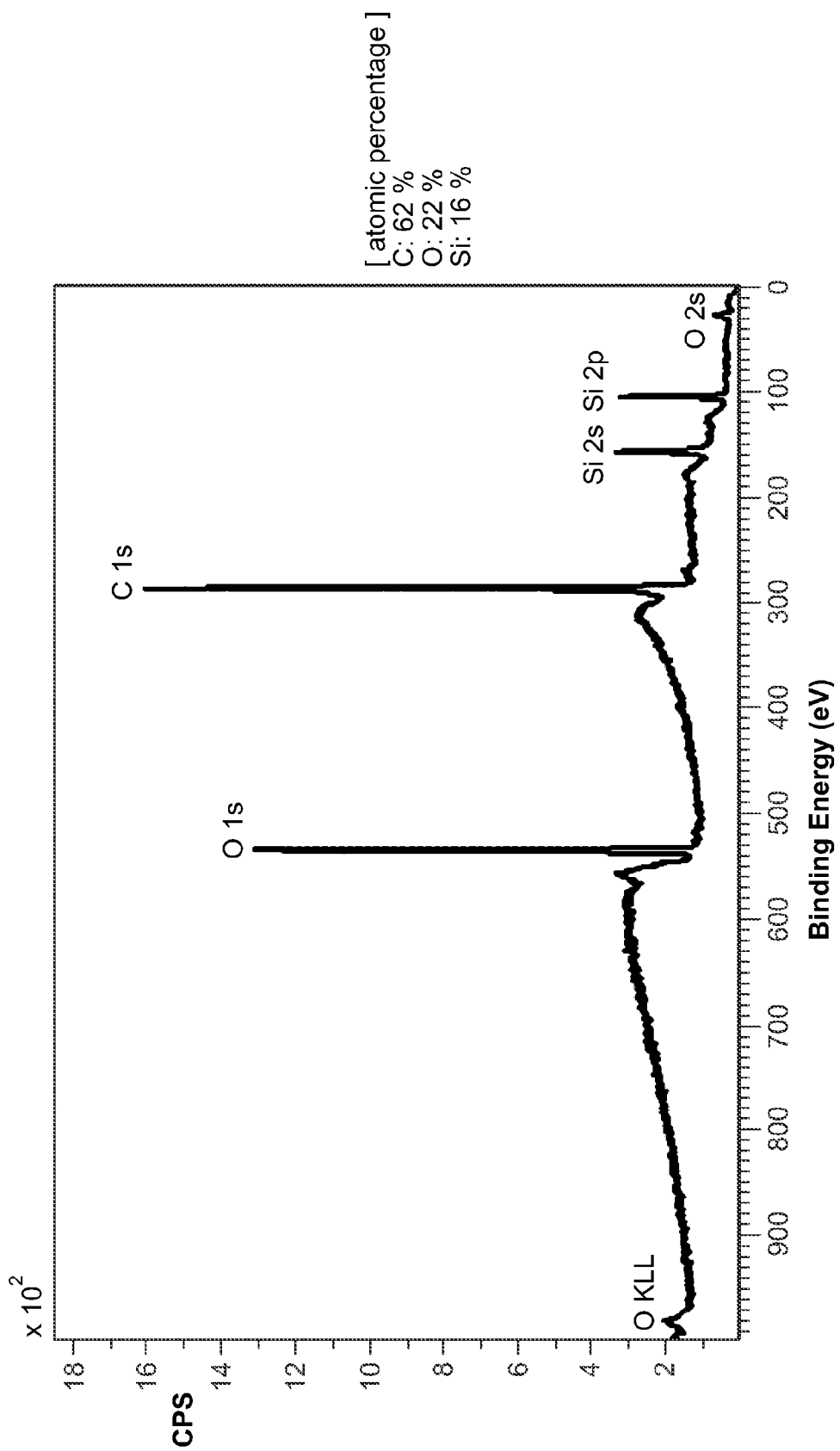

FIGS. 8A and 8B are plots of EDAX and XPS analysis, respectively, of the graphene/graphite structures, taken after etching the Cu, Ni, and Co catalyst metals off of the configuration by the wet etch described above. No characteristic peak of the metals was detected, indicating that the metal residue on the synthesized graphene/graphite regions was negligible.

EXAMPLE II

Figure 9A:
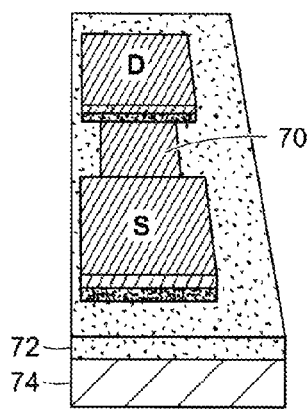
FIG. 9A is a schematic perspective view of an experimental graphene FET structure for analyzing FET channel current characteristics as a function of number of graphene layers.

Following the graphene synthesis process of Example I, a graphene catalyst region of Cu of 700 nm in thickness having a 5 nm-thick Ni top layer and a graphene catalyst region of a layered combination of Cu/Ni/Co of thicknesses 700 nm/5 nm/400 nm was subjected to the synthesis process of Example I. With the PMMA handle layer transfer procedure of Example I, the resulting graphene and graphite structures were transferred to a layer of 285 nm-thick silicon dioxide on a silicon wafer, and the structures were plasma etched with an oxygen plasma to produce channel regions. Electrodes were then deposited as 70 nm-thick Au regions, with a 3 nm-thick Cr adhesion layer. FIG. 9A is a schematic of this arrangement, with a channel 70 between a source, S, and drain, D, on the oxide layer 72 and substrate 74. The Cu/Ni catalyst region produced a graphene region of 2-3 layers and the Cu/Ni/Co catalyst region produced a region of about 850 layers of graphene.

Figure 9B:
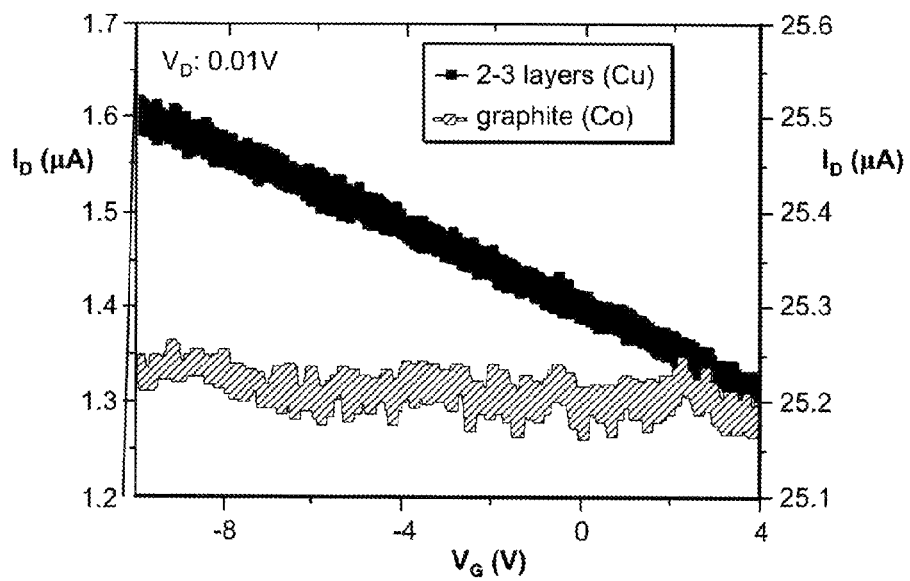
FIG. 9B is a plot of measured graphene FET drain current as a function of back gate voltage for the structure of FIG. 9A for a synthesized graphene FET channel of 2-3 layer graphene and for a synthesized graphene FET channel of graphite.

FIG. 9B is a plot of current through the channel regions as a function of voltage applied between the source and drain regions for the two different synthesized channels. This plot shows that current modulation versus gate potential is much stronger in 2-3 layer graphene channel, compared to a negligible change in the thick graphite channel, due to the stronger screening effect. This demonstrates that the 2-3 layer graphene region, and monolayer graphene, is well-suited as an FET channel and can be monolithically integrated as such for use in a device and/or circuit.

EXAMPLE III

A back-gated graphene FET like that of FIG. 4F was fabricated following the synthesis process of Examples I and II. A catalyst pattern like that of FIG. 4D was employed, with a blanket coating of Cu of 700 nm in thickness/Ni of 5 nm thickness, for producing a 2-3 layer graphene transistor channel, and regions of Cu of 700 nm in thickness/Ni of 5 nm in thickness/Co of 400 nm in thickness, for producing graphite source (S) and drain (D) transistor regions. After CVD synthesis of the graphene and graphite device regions following the process of Example I, the structure was transferred to a 285 nm-thick $SiO_2$ dielectric layer on a Si wafer after a reactive ion etch (RIE) isolation step, to produce backgate monolithic graphene transistors with graphite S/D regions. The FET channel region was etched to provide dimensions of 1 μm in width and 5 μm in length.

The current, $I_D$, as a function of backgate voltage, $V_G$, with the silicon substrate biased as the backgate, was measured at room temperature for a drain voltage of 0.1 V with a probe station (Model 12561B, Cascade Microtech) with a computer-controlled analog-to-digital converter (model 6030E, National Instruments) and a variable gain amplifier (1211 current preamplifier, DL Instruments, Inc.).

Figure 10:
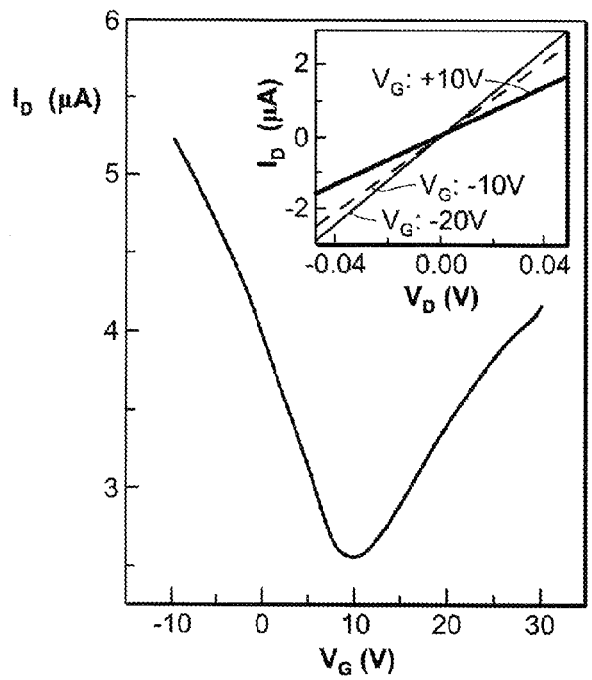
FIG. 10 is a plot of measured drain current as a function of backgate voltage for a graphene FET having the structure of FIG. 4F, and a plot of measured drain current as a function of gate voltage for three gate voltages.

FIG. 10 is a plot of the measured drain current, $I_D$, as a function of gate voltage, and the inset of the plot is the curve of measured drain current, $I_D$, as a function of drain voltage for three backgate voltages, +10 V, −10 V, and −20 V. This current-voltage relationship demonstrates ambipolar behavior consistent with the expected semi-metallic character of graphene, with a positive charge neutrality point of 10±2 V.

The average hole mobility was determined to be 718±294 $cm^2/V \cdot s$, and the average electron mobility was determined to be 230±137 $cm^2/V \cdot s$, calculated using a standard MOSFET model with a parallel plate gate dielectric capacitance of $1.21 \times 10^{-8}$ $F/cm^2$. It is recognized that polycrystallinity and the existence of ripples or wrinkles in CVD-synthesized graphene can influence field-effect mobility of graphene devices, due, e.g., to increased carrier scattering from these defects. The likelihood of incorporation of such defects increases for larger graphene channel areas and for larger grain sizes, and hence the mobilities can be different for different channel sizes. For example, there was observed the reduction of the mobilities to less than about 150 $cm^2/V \cdot s$ for relatively large channel sizes of greater than about 40×20 $\mu m^2$.

EXAMPLE IV

Figure 11:
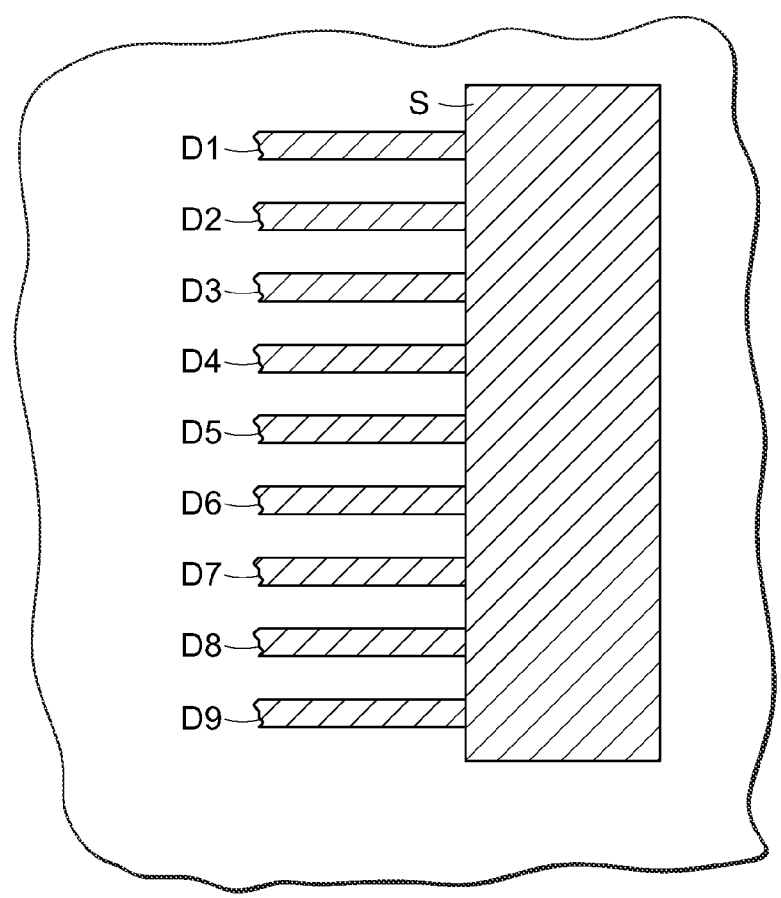
FIG. 11 is a schematic plan view of an experimental array of nine graphene FETs sharing a common source electrode.

An array of graphene FETs was fabricated following the CVD synthesis process of Example I and the design of FIG. 4F, for sensing-based gating of the graphene channels. The array was provided on a Si wafer having a 285 nm-thick $SiO_2$ surface layer. As shown in FIG. 11, nine individual FETs were fabricated, with the FETs together sharing a single common source, S, and each FET provided with an independent channel and drain region, D1-D9. Four blocks of such groups of nine FETs were fabricated and disposed on the substrate. The graphite electrode connections to the FETs were covered with a 2 μm-thick SU8 passivation layer with openings around the graphene channels, which were 2-3 layer graphene.

Figure 12A:
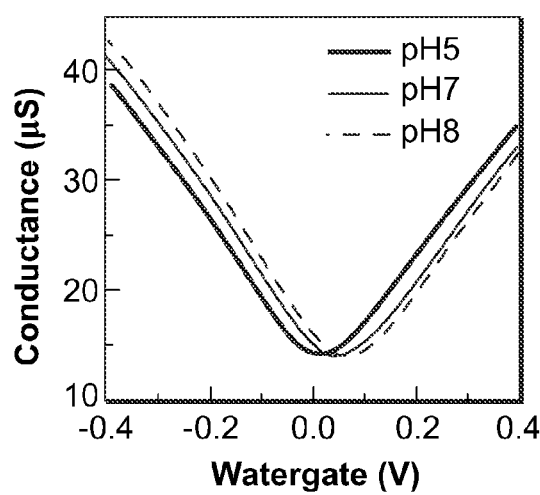
FIG. 12A is a plot of measured graphene FET channel conductance as a function of watergate potential for liquid solutions of pH 5, pH 7, and pH 8.

The FET arrays were employed as biosensors for sensing pH. As such, the arrays were exposed to liquids of differing pH. In one experiment, the FET arrays were exposed to solutions of pH 5, pH 7, and pH 8. The conductance change of each FET channel was measured while sweeping a water-gate bias. FIG. 12A is a plot of the measured FET conductance as a function of water-gate bias. The charge neutrality point shifted positively with increasing pH, and the pH sensitivity was ~17 mV/pH. The conductance curves exhibited the ambipolar characteristic of graphene, and therefore pH sensing in both p-type and n-type graphene conductivity regimes was possible.

Figure 12B:
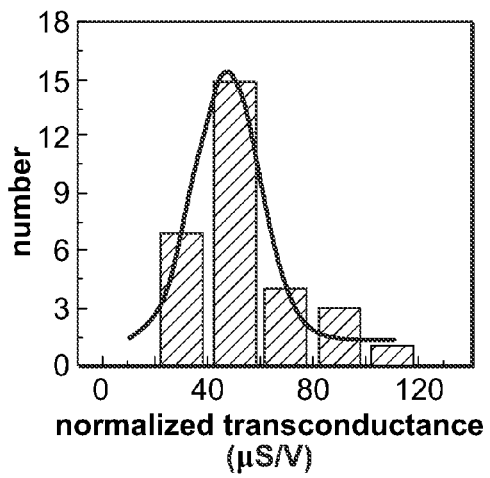
FIGS. 12B-12C are statistical plots of measured transconductance and charge neutrality points for the graphene FET array of FIG. 12A.
Figure 12C:
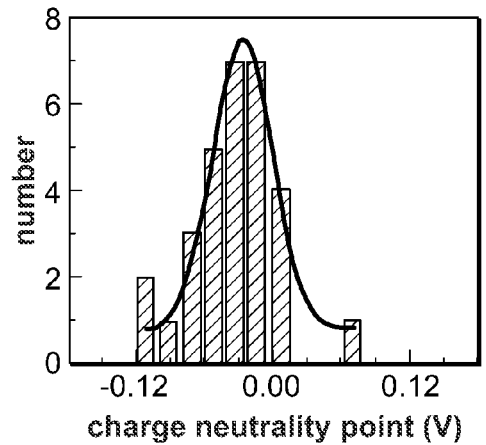

The statistic distribution of normalized transconductance for the FET array is shown in FIG. 12B and the charge neutrality point for the solution of pH 7 for the graphene FET array is shown in FIG. 12C. Gaussian fits of the two parameters indicated center values of normalized transconductance and charge neutrality point of 54±19.9 μS/V and −0.05±0.046 V, respectively.

The arrays of graphene FETs were operated for real-time multiplexed pH sensing. For operation in the graphene p-type regime, a water gate potential of −0.1 V was employed, and for operation in the graphene n-type regime, a water gate potential of +0.3 V was employed. For each n-type and p-type experiment, the solution pH was adjusted from pH 5 to pH 8 and back to pH 5. Multichannel pH sensing was carried out by monitoring the conductance with AC bias at 79 Hz, 6 mV peak-to-peak, and DC bias set to 0 V. The drain current from multiple devices was amplified with custom-designed variable gain amplifiers (multi-channel current preamplifier, Sci-Math Systems, LLC) and filtered using computer-based virtual lock-in amplifiers (multiplex 128-channel digital lock-in amplifier setup kit, National Instruments) with the time constant set to 300 ms. Time-variant conductance changes were recorded while different pH solutions were delivered through a microfluidic channel to the FETs. Watergate characterization was carried out using the same measurement setup by sweeping a Ag/AgCl reference electrode inserted into the microfluidic chamber with a sweeping speed of 5 mV/sec.

Figure 12D:
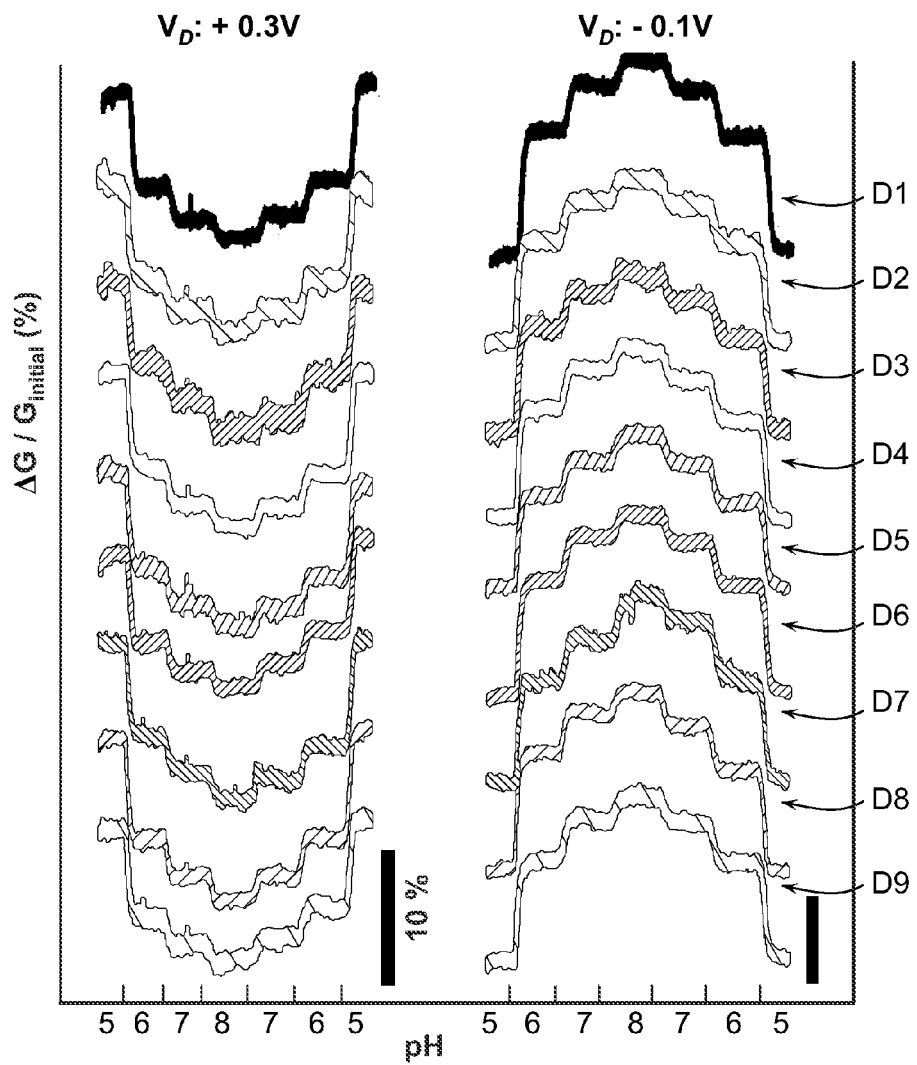
FIG. 12D is a plot of normalized measured change in conductance for the graphene FETs in the graphene FET array of FIG. 12A for real-time changes in pH solution from pH 5 to pH 8 and back to pH 5.

FIG. 12D is a plot of measured change in channel conductance, ΔG, for each of the nine FETs in an array of FETs, for the p-type operation and for the n-type operation. The $G_{initial}$ value is the measured conductance at the starting condition of pH 5. As shown in the plot, the graphene channel conductance increased by increasing the pH in the p-type operational regime, with a water gate potential of −0.1 V, and decreased by reducing the pH in n-type operational regime, with a water gate potential: +0.3 V, thus displaying complementary sensing. This complementary sensing between p- and n-type regimes of graphene operation is advantageous and unique for graphene-based devices. Such multiplexed monolithic graphene biosensor arrays can be exploited as chemical and biological sensors, where high sensitivity and simultaneous, multiplexed monitoring are necessary.

EXAMPLE V

Top-gated graphene FETs were fabricated as in Example I, with a channel region of 2-3 layer graphene and interconnects and source and drain regions of about 850 graphene layers. After graphene synthesis as in Example I, the structure was transferred onto a flexible and transparent polyether ether ketone (PEEK) film, followed by deposition of a $SiO_2$ dielectric layer of about 285 nm in thickness. Topgate lines of 6-8 layers of graphene were formed on the $SiO_2$ by synthesis with a catalyst of Cu of 700 nm in thickness with an upper 25 nm-thick Ni coating as in Example I and then transfer to the dielectric layer, with plasma etch for topgate patterning, to complete formation of flexible, monolithic, topgate FETs.

The resulting top-gated FETs were characterized by semi-transparency as well as flexibility. Transmittance of single layer graphene is ~97% at a wavelength of about 550 nm, and decreases with higher numbers of graphene layers. Therefore the overall transparency of monolithic graphene/graphite devices can be adjusted by selection of the number of graphene layers of each device component. Although distinguishably colored, but relatively less transparent, the thick graphite regions of the source, drain, and interconnects enabled alignment of the topgate patterns using a conventional mask aligner. It is to be recognized that by selection of number of graphene device layers, the transmittance of various device regions can be tailored for fabrication consideration and for operational and performance considerations.

Figure 13A:
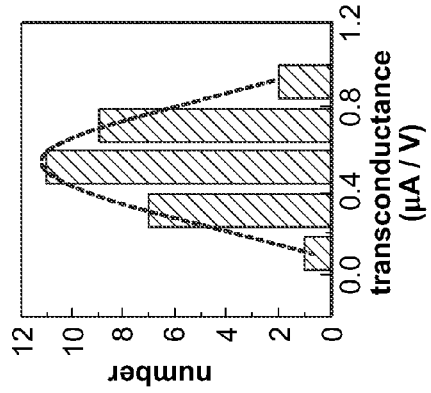
FIGS. 13A-13C are statistical plots of measured charge neutrality points and transconductance of experimental top-gated graphene FETs disposed on a flexible PEEK substrate.
Figure 13B:
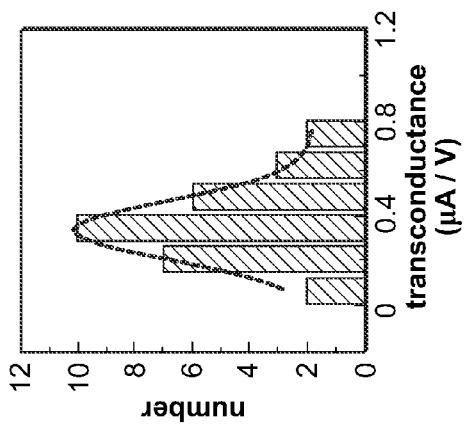
Figure 13C:
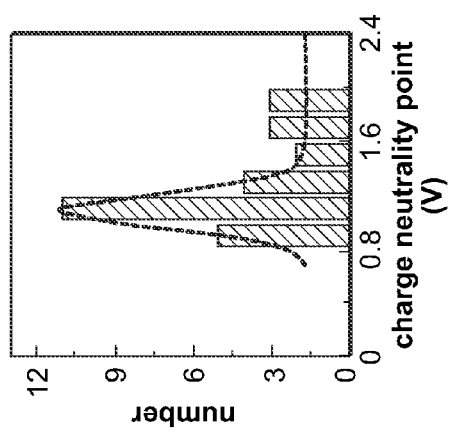

FIG. 13A is a plot of the statistical distribution of the charge neutrality point of an array of top-gated FETs, fit to a Gaussian profile. FIGS. 13B-13C are plots of transconductance of the topgate FET array, also fit to Gaussian profiles. It was found that compared to a backgate graphene FETs configuration, the charge neutrality point shifted of the top-gated graphene FETs shifted close to zero, possibly due to oxygen desorption from graphene on the $SiO_2$ deposition step.

Figure 13D:
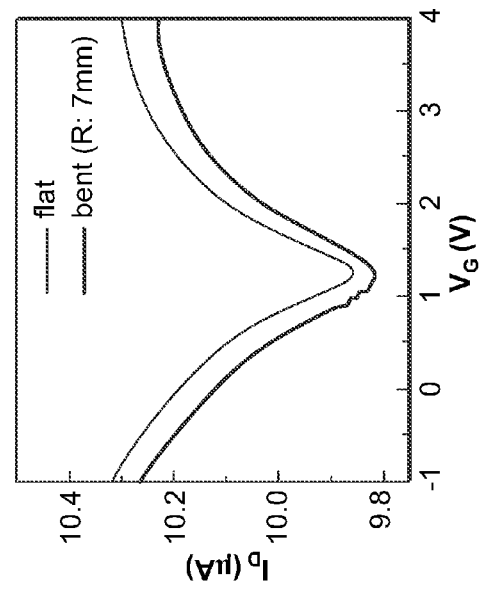
FIG. 13D is a plot of measured graphene FET drain current as a function of top gate voltage for an experimental top-gated graphene FET on a flexible PEEK substrate that is flat and that is bent in a 7 mm radius of curvature.

To study the mechanical flexibility of the monolithic graphene-graphite integrated electronics, I-V characteristics of the circuits were investigated. FIG. 13D is a plot of drain current, $I_D$, as a function of topgate voltage, $V_G$, of a top-gated graphene FET, when the PEEK substrate was maintained flat and when the PEEK substrate was bent in a radius of curvature of about 0.7 cm. No significant change in the current-voltage dependence was found to occur such small bending radius of curvature, for which the estimated bending-induced strain was about 0.6%. It is found that by creating free-standing graphene forms with no substrate to rule out deformations related with substrate adhesions, the electrical properties of the monolithic graphene/graphite devices can be maintained nearly constant by applying a maximum strain of at least about 2.2%.

With these examples, it is demonstrated that the ability to integrate devices in a single-step graphene synthesis process enables the production of large numbers of monolithic graphene-graphite devices for a wide range of applications. There further is demonstrated the ability of a single-step CVD graphene synthesis process to build monolithically-integrated electronic devices having structures and regions of varying numbers of graphene layers to produce, e.g., graphene channels and graphite electrodes, as well as circuit interconnects and contact pads. The arrangement of regions of differing number of graphene layers that is produced across a substrate is determined by the arrangement of catalyst materials that are provided at those regions. As a result, in one step, there can be produced a range of number of layers of graphene across a substrate. A significant advantage over conventional CMOS processes is therefore attained by enabling the single-step formation of entire devices during one graphene synthesis step. In addition, the ability to conduct layer-by-layer assembly of synthesized monolithic graphene/graphite patterns can be exploited, e.g., to produce flexible and transparent integrated electronic devices. The one-step graphene synthesis method to produce monolithic graphene-graphite integrated circuits thereby moves microfabrication technology to an enabled graphene-based electronics paradigm.

It is recognized that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A method for fabricating a graphene structure comprising:
   on a fabrication substrate, forming a pattern of a plurality of graphene synthesis catalyst regions, each of the graphene synthesis catalyst regions in the plurality including a different graphene catalyst material, and each of the different graphene catalyst materials having a different carbon solubility; and
   in one graphene synthesis step, exposing the different graphene catalyst materials of the plurality of graphene synthesis catalyst regions to a source of carbon, forming a different number of graphene layers on the different graphene catalyst materials in the formed pattern.

2. The method of claim 1 wherein the graphene synthesis step comprises exposure of the graphene catalyst materials to a carbonaceous gas.

3. The method of claim 2 wherein the carbonaceous gas comprises methane gas.

4. The method of claim 1 wherein the graphene synthesis step comprises chemical vapor deposition with methane gas.

5. The method of claim 1 wherein the plurality of graphene synthesis catalyst regions having different distinct graphene catalyst materials comprise materials selected from the group consisting of Co, Cu, Fe, Ge, Al, Ni, Pd, Pt, and Au, alloys thereof, and layered combinations thereof.

6. The method of claim 1 wherein the different graphene catalyst materials include a layered combination of Cu and Ni.

7. The method of claim 1 wherein the different graphene catalyst materials include a layered combination of Cu, Ni, and Co.

8. The method of claim 1 wherein the different graphene catalyst materials include Cu, Ni, and Co.

9. The method of claim 1 further comprising:
applying a layer of handle material on the formed graphene layers;
removing the plurality of catalyst regions and the fabrication substrate from the formed graphene layers; and
applying the graphene layers, in the formed pattern, onto an operational substrate.

10. The method of claim 1 wherein forming a pattern comprises forming an arrangement of a plurality of the different graphene catalyst materials in a graphene electronic device and graphene electrical connections to the device.

11. The method of claim 1 wherein each in the plurality of graphene synthesis catalyst regions having a different graphene catalyst material has a different catalyst material thickness.

12. A method for fabricating a graphene transistor comprising:
on a fabrication substrate, providing at least one graphene catalyst material at a substrate region that is specified for synthesizing a graphene transistor channel, the graphene transistor channel catalyst having a first carbon solubility;
on the fabrication substrate, providing at least one graphene catalyst material at a substrate region that is specified for synthesizing a graphene transistor source and at a substrate region that is specified for synthesizing a graphene transistor drain, each of the graphene transistor source and drain catalyst materials having a carbon solubility that is different than the first carbon solubility;
in one graphene synthesis step, forming at least one layer of graphene at the substrate region specified for the graphene transistor channel, and forming at the region specified for the transistor source and the region specified for the transistor drain a plurality of layers of graphene that is greater than the at least one layer of graphene of the transistor channel.

13. The method of claim 12 further comprising:
applying a layer of a gate dielectric over the formed graphene layers; and
forming a graphene transistor gate of a plurality of layers of graphene on the gate dielectric layer.

14. The method of claim 12 further comprising:
applying a layer of handle material on the formed graphene layers;
removing the plurality of catalyst materials and the fabrication substrate from the formed graphene layers; and
applying the graphene layers, in a pattern of the transistor channel, transistor source region, and transistor drain region, onto an operational substrate.

15. The method of claim 14 wherein the operational substrate comprises a silicon wafer.

16. The method of claim 14 wherein the operational substrate comprises a mechanically flexible, non-rigid material.

17. The method of claim 14 wherein the operational substrate includes a layer of dielectric material, and further comprising making electrical connection to the operational substrate as a transistor back gate.

18. The method of claim 14 wherein applying the graphene layers, in a pattern of the transistor channel, transistor source, and transistor drain regions, onto an operational substrate comprises applying a plurality of patterns of transistor channel, transistor source, and transistor drain regions onto an operation substrate in an array of graphene transistors.

19. The method of claim 12 wherein the at least one graphene catalyst material provided for synthesizing a graphene transistor channel comprises Cu and Ni.

20. The method of claim 12 wherein the at least one graphene catalyst material provided for synthesizing a graphene transistor source and a graphene transistor drain comprises Co, Cu, and Ni.

21. The method claim 12 wherein forming at the region specified for the transistor source and the region specified for the transistor drain a plurality of layers of graphene comprises forming at least about 800 layers of graphene.

22. The method of claim 12 wherein providing at least one graphene catalyst material at a substrate region comprises providing a graphene transistor channel catalyst region of a first thickness; and
wherein providing a graphene catalyst material at a substrate region that is specified for synthesizing a graphene transistor source and providing a graphene catalyst material at a substrate region that is specified for synthesizing a graphene transistor drain comprises providing a graphene transistor source catalyst region and a graphene transistor drain catalyst region each of a second thickness that is greater than the first thickness.

23. A graphene transistor comprising:
a substrate;
a graphene transistor channel disposed on the substrate and comprising at least one layer of graphene; and
a transistor source and a transistor drain, each of which is connected to the transistor channel and disposed on the substrate, and each comprising a plurality of layers of graphene that is greater than the at least one layer of graphene of the transistor channel.

24. The graphene transistor of claim 23 wherein the substrate is electrically conducting and includes a dielectric layer on which the transistor channel, source, and drain are disposed, and is connected as a back gate for the graphene transistor.

25. The graphene transistor of claim 23 further comprising:
a dielectric layer disposed over the transistor channel; and
a graphene transistor gate that is disposed on the dielectric layer and comprising a plurality of layers of graphene, and that is connected as a top gate for the graphene transistor.

26. The graphene transistor of claim 23 wherein the substrate comprises a flexible, non-rigid material.

27. The graphene transistor of claim 23 wherein the substrate comprises a silicon substrate including a layer of silicon dioxide.

28. The graphene transistor of claim 23 wherein the transistor source and transistor drain each comprise a number of layers of graphene that is greater than about 800 layers.

29. The graphene transistor of claim 23 wherein the transistor channel comprises about 1-3 layers of graphene.

30. The graphene transistor of claim 23 wherein the substrate comprises a material selected from semitransparent materials and transparent materials.

31. A graphene circuit comprising:
a substrate;
a graphene transistor channel disposed on the substrate and comprising at least one layer of graphene;
a transistor source and a transistor drain, each of which is connected to the transistor channel and disposed on the substrate, and each comprising a plurality of layers of graphene that is greater than the at least one layer of graphene of the transistor channel; and
electrical interconnections to the transistor source and drain, each interconnection comprising a plurality of layers of graphene.

32. The graphene circuit of claim 31 wherein the substrate comprises a silicon substrate including a layer of silicon dioxide.

\* \* \* \* \*